(12) United States Patent
Skarzynski et al.

(10) Patent No.: US 12,425,178 B2
(45) Date of Patent: Sep. 23, 2025

(54) MULTI-CHIP SYNCHRONIZATION IN SENSOR APPLICATIONS

(71) Applicant: Cirrus Logic International Semiconductor Ltd., Edinburgh (GB)

(72) Inventors: Jeffrey Skarzynski, Austin, TX (US); Wai-Shun Shum, Austin, TX (US); Amar Vellanki, Cedar Park, TX (US); Venugopal Choukinishi, Austin, TX (US); Xin Zhao, Austin, TX (US); John L. Melanson, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 76 days.

(21) Appl. No.: 18/471,856

(22) Filed: Sep. 21, 2023

(65) Prior Publication Data

US 2024/0187205 A1 Jun. 6, 2024

Related U.S. Application Data

(60) Provisional application No. 63/430,241, filed on Dec. 5, 2022.

(51) Int. Cl.
*H04L 7/033* (2006.01)
*H04J 3/06* (2006.01)

(52) U.S. Cl.
CPC ............ *H04L 7/033* (2013.01); *H04J 3/0688* (2013.01)

(58) Field of Classification Search
CPC ...... H04J 3/0688; H04J 3/0658; H04J 3/0617; H04J 3/0697; H04L 7/033; H04L 7/0008; H03L 7/0807
See application file for complete search history.

(56) References Cited

U.S. PATENT DOCUMENTS

| | | | |
|---|---|---|---|
| 11,088,816 B1* | 8/2021 | Sarda | H04L 7/0037 |
| 2014/0254431 A1* | 9/2014 | Yan | H04Q 11/04 |
| | | | 370/255 |
| 2016/0269828 A1* | 9/2016 | Smith | H04R 3/14 |
| 2017/0041127 A1* | 2/2017 | Sharpe-Geisler | G06F 13/4291 |
| 2017/0222790 A1* | 8/2017 | Hooper | H04H 60/00 |
| 2021/0328758 A1* | 10/2021 | Sarda | H03L 7/08 |
| 2021/0406210 A1* | 12/2021 | Sachse | G06F 13/4063 |
| 2022/0224432 A1* | 7/2022 | Coulter | H04J 3/0697 |

OTHER PUBLICATIONS

IEEE 100, The Authoritative Dictionary of IEEE Standards Terms, Seventh Edition (Year: 2000) (Year: 2000).*
Definition of "packet"; The New IEEE Standard Dictionary of Electrical and Electronics Terms, 5th Ed., p. 911 (1993).

* cited by examiner

*Primary Examiner* — Aristocratis Fotakis
(74) *Attorney, Agent, or Firm* — Jackson Walker L.L.P.

(57) ABSTRACT

A system may include a plurality of devices coupled to one another via a shared digital wired communication link, the plurality of devices comprising a first device configured to periodically transmit a synchronization packet onto the shared digital wired communication link to synchronize other of the plurality of devices to a reference clock of the first device, a second device configured to receive the synchronization packet and transmit one or more first data packets onto the shared digital wired communication link in response to the synchronization packet, and a third device configured to receive the synchronization packet and transmit one or more second data packets onto the shared digital wired communication link in response to the synchronization packet and the one or more second data packets.

14 Claims, 2 Drawing Sheets

MULTI-CHIP SYNCHRONIZATION IN SENSOR APPLICATIONS

RELATED APPLICATION

The present disclosure claims priority to U.S. Provisional Patent Application Ser. No. 63/430,241, filed Dec. 5, 2022, which is incorporated by reference herein in its entirety.

FIELD OF DISCLOSURE

The present disclosure relates in general to systems of electronic devices (e.g., sensor devices or other devices comprising analog-to-digital converters) having a common digital wired communication link and centralized control by one of the electronic devices of the system.

BACKGROUND

When multiple devices having analog-to-digital converters (ADCs) exist in a system in which processing of the ADC data is performed centrally, it is often desirable to synchronize the ADC sampling times if possible. Unsynchronized ADC sampling across multiple devices may result in undesirable effects to the system. When data is communicated periodically over a digital communications link that is shared among multiple devices, the timing of data among all devices on the digital communications link must be controlled. However, due to clocking variances among devices in a system, it may be difficult to synchronize when data is sent in order to avoid collisions without an external clock source or other means of controlling the data communicated. An external clock source may require an additional external clock and clock routing, which may be burdensome in embedded applications. Other existing techniques may require allocating excessive time to encapsulate wide timing variance among different devices or tight timing requirements that may be difficult to achieve.

SUMMARY

In accordance with the teachings of the present disclosure, the disadvantages and problems associated with synchronization of and communication by multiple devices on a shared digital communication link may be reduced or eliminated.

In accordance with embodiments of the present disclosure, a system may include a plurality of devices coupled to one another via a shared digital wired communication link, the plurality of devices comprising a first device configured to periodically transmit a synchronization packet onto the shared digital wired communication link to synchronize other of the plurality of devices to a reference clock of the first device, a second device configured to receive the synchronization packet and transmit one or more first data packets onto the shared digital wired communication link in response to the synchronization packet, and a third device configured to receive the synchronization packet and transmit one or more second data packets onto the shared digital wired communication link in response to the synchronization packet and the one or more second data packets.

In accordance with these and other embodiments of the present disclosure, a method for a system comprising a plurality of devices coupled to one another via a shared digital wired communication link may include periodically transmitting, by a first device of the plurality of devices, a synchronization packet onto the shared digital wired communication link to synchronize other of the plurality of devices to a reference clock of the first device. The method may also include receiving, by a second device of the plurality of devices, the synchronization packet. The method may additionally include transmitting, by the second device, one or more first data packets onto the shared digital wired communication link in response to the synchronization packet. Further, the method may include receiving, by a third device of the plurality of devices, the synchronization packet. In addition, the method may include transmitting, by the third device, one or more second data packets onto the shared digital wired communication link in response to the synchronization packet and the one or more second data packets.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
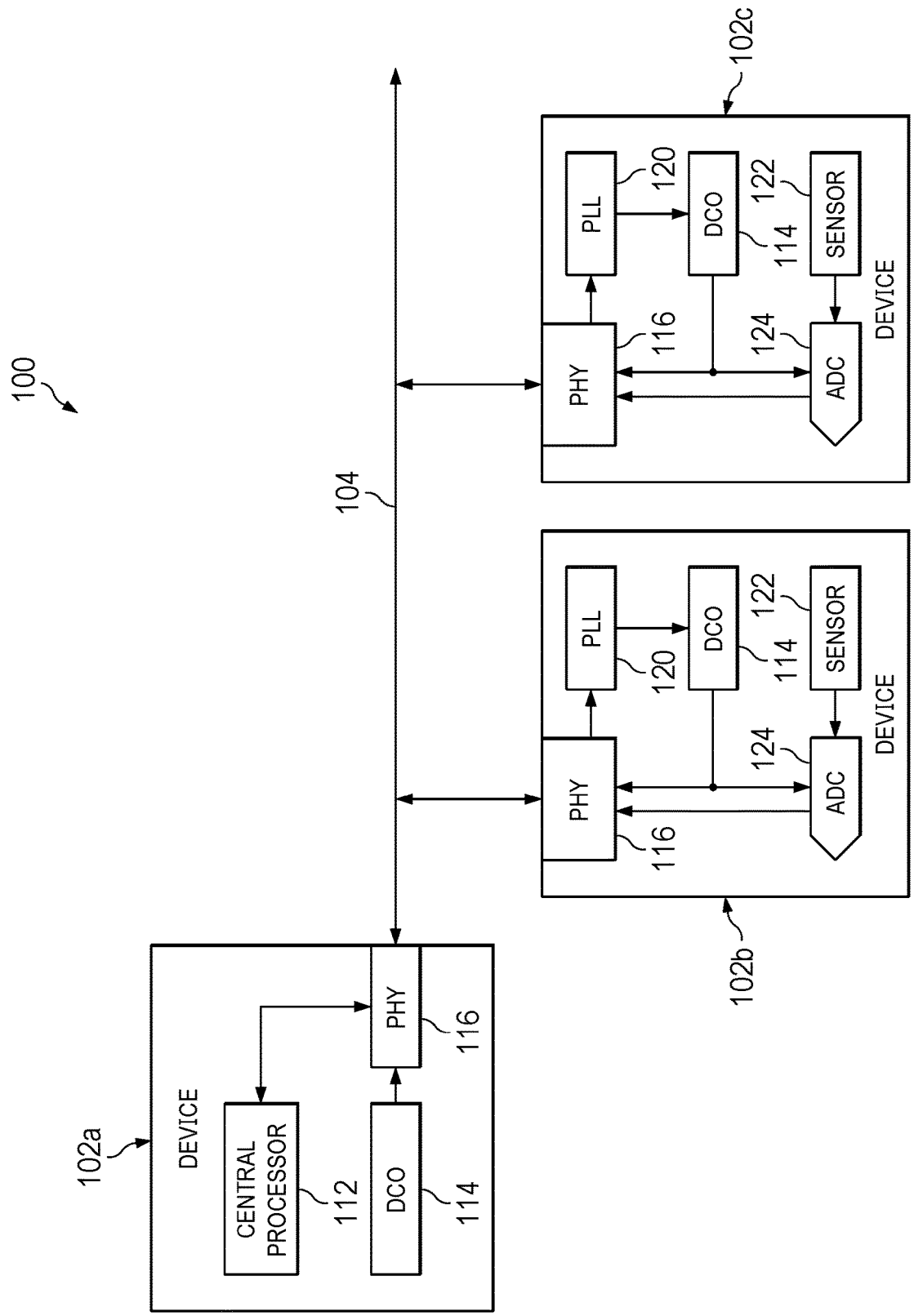
FIG. 1 illustrates a block diagram of selected components of an example system comprising multiple devices coupled to one another by a shared digital wired communications link, in accordance with embodiments of the present disclosure.

In accordance with embodiments of the present disclosure, in a system in which multiple devices are coupled to one another via a digital wired communication link, a main device may periodically communicate a synchronization packet via the digital communication link which may be used as a reference for clock synchronization of other devices. Such synchronization packet may signal a sequence of data packets communicated by the other devices in response to the synchronization packet. In accordance with such sequence, each device may begin its own transmission of packets responsive to completion of packet transmission by another device. As a result, the relative timing of each device's clock is not as critical because each device relies on a previous device's transmission, and not a particular day or timing.

In accordance with embodiments of the present disclosure, systems and methods are provided in which multiple devices are coupled to one another via a digital wired communication link. A first device may periodically communicate a synchronization packet to synchronize the other devices coupled to the digital wired communication link. The synchronization packet may be used as a timing element to align internal clock references of the devices coupled to the digital wired communication link. Each device may include a phase-locked loop or other clock circuitry to lock its internal clock reference to timing parameters of the synchronization packet. In addition, in some embodiments, the synchronization packet may include information (e.g., metadata) defining a sequence for order to transmission by devices responsive to the synchronization packet. In these and other embodiments, the synchronization packet may set forth information (e.g., metadata) regarding particular data the first device seeks to obtain from one or more of the other devices.

A second device coupled to the digital wired communication link may receive the synchronization packet and communicate one or more first data packets on the digital wired communication link in response to the synchronization packet. In some embodiments, the one or more first data packets may comprise sensor data from an analog-to-digital converter (ADC) of the second device. In these and other embodiments, the one or more first data packets may include information (e.g., metadata) indicating a next device of the multiple devices to transmit. In these and other embodiments, a last one of the one or more first data packets may include information (e.g., metadata) indicating that it is the final packet to be communicated as part of the second device's communication.

A third device coupled to the digital wired communication link may receive the synchronization packet and the one or more first data packets and communicate one or more second data packets on the digital wired communication link in response to the synchronization packet and the one or more first data packets. In some embodiments, the one or more second data packets may comprise sensor data from an analog-to-digital converter (ADC) of the third device. In these and other embodiments, the one or more second data packets may include information (e.g., metadata) indicating a next device of the multiple devices to transmit. In these and other embodiments, a last one of the one or more second data packets may include information (e.g., metadata) indicating that it is the final packet to be communicated as part of the third device's communication.

FIG. 1 illustrates a block diagram of selected components of an example system 100 comprising multiple devices 102 (e.g., devices 102a, 102b, 102c) coupled to one another by a shared digital wired communications link 104, in accordance with embodiments of the present disclosure. As shown in FIG. 1, device 102a may comprise a "main" device within system 100, and may include a central processor 112 configured to control operation of devices 102. Central processor 112 may include any suitable processing device, including without limitation a microprocessor, application-specific integrated circuit, digital signal processor, etc. Device 102a may also include a digital-controlled oscillator (DCO) 114 that may generate a clock signal for device 102a as well as provide a reference clock for other devices 102 coupled to shared digital wired communications link 104. Further, device 102a may include a physical interface (PHY) 116 which may serve as a transmitter/receiver for transmitting digital packets onto shared digital wired communications link 104 and for receiving digital packets from shared digital wired communications link 104 (e.g., for processing by central processor 112).

Other devices 102 (e.g., devices 102b and 102c) of system 100 may include sensor devices or other suitable devices that may receive data from and/or transmit data to shared digital wired communications link 104. As shown in FIG. 1, each of devices 102b and 102c may include a PHY 116, similar to device 102a. Further, each device 102b, 102c may include a phase-locked loop (PLL) 120 configured to lock its own internal clock to clock synchronization parameters communicated in synchronization packets by device 102a onto shared digital wired communications link 104. Accordingly, PLL 120 may provide a clock reference to DCO 114 of each device 102b, 102c to generate internal clocks for each device 102b, 102c.

As also shown in FIG. 1, each device 102b, 102c may include a sensor 122 and an ADC 124. A sensor 122 may comprise any system, device, or apparatus configured to sense a physical quantity (e.g., temperature, humidity, voltage, current, pressure, etc.) and generate an analog electrical signal indicative of the sensed physical quantity. In turn, an ADC 124 may receive the analog electrical signal indicative of the sensed physical quantity and convert it to an equivalent digital signal, which may be transmitted by PHY 116 onto shared digital wired communications link 104 (e.g., for receipt and processing by device 102a).

In some embodiments, a distance between any two of device 102 may be less than one meter.

Figure 2:
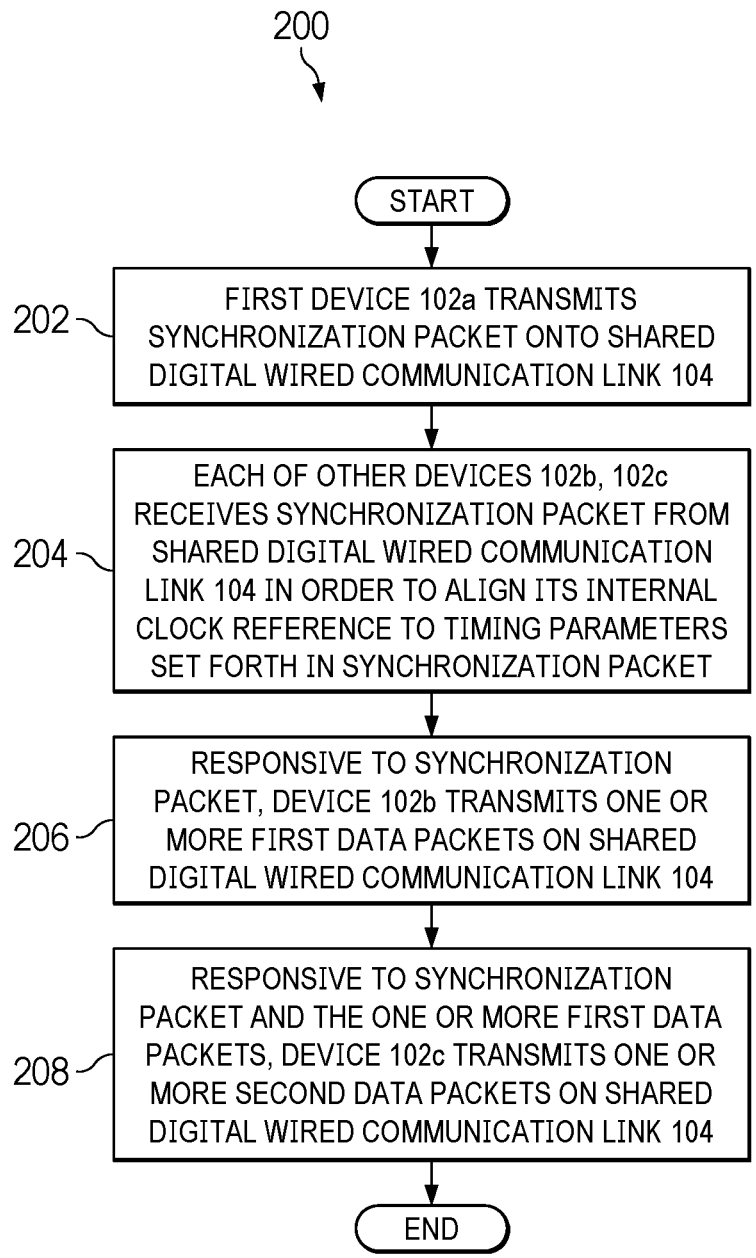
FIG. 2 illustrates a flow chart of an example method for sequencing communication of multiple devices over a shared digital communications link, in accordance with embodiments of the present disclosure.

FIG. 2 illustrates a flow chart of an example method 200 for sequencing communication of multiple devices over a shared digital communications link, in accordance with embodiments of the present disclosure. According to some embodiments, method 200 may begin at step 202. As noted above, teachings of the present disclosure may be implemented in a variety of configurations of system 100. As such, the preferred initialization point for method 200 and the order of the steps comprising method 200 may depend on the implementation chosen.

At step 202, first device 102a may transmit a synchronization packet onto shared digital wired communication link 104. In some embodiments, the synchronization packet may include information (e.g., metadata) defining a sequence for order of transmission by devices 102b, 102c responsive to the synchronization packet. In some instances, not all devices coupled to shared digital wired communication link 104 may be listed in such sequence, such as when first device 102a does not require information from one or more of such devices. In these and other embodiments, the synchronization packet may set forth information (e.g., metadata) regarding particular data the first device seeks to obtain from each of the one or more of the other devices 102b, 102c.

At step 204, each of other devices 102b, 102c may receive the synchronization packet from shared digital wired communication link 104 in order to align its internal clock reference to timing parameters set forth in the synchronization packet.

At step 206, responsive to the synchronization packet, device 102b (the identity of which may be determined a priori, by metadata set forth in the synchronization packet, or via any other suitable means) may transmit one or more first data packets on shared digital wired communication link 104. In some embodiments, the one or more first data packets may comprise sensor data from an analog-to-digital converter (ADC) of device 102b. In these and other embodiments, the one or more first data packets may include information (e.g., metadata) indicating a next device of the multiple devices of system 100 to transmit. In these and other embodiments, a last one of the one or more first data packets may include information (e.g., metadata) indicating that it is the final packet to be communicated as part of the transmission by device 102b.

At step 208, responsive to the synchronization packet and the one or more first data packets, device 102c (the identity of which may be determined a priori, by metadata set forth in the synchronization packet, metadata set forth in the one or more first data packets, or via any other suitable means) may transmit one or more second data packets on shared digital wired communication link 104. In some embodiments, the one or more second data packets may comprise sensor data from an analog-to-digital converter (ADC) of device 102c. In these and other embodiments, the one or more second data packets may include information (e.g., metadata) indicating a next device of the multiple devices of system 100 to transmit. In these and other embodiments, a last one of the one or more second data packets may include information (e.g., metadata) indicating that it is the final packet to be communicated as part of the transmission by device 102c.

After step 208, method 200 may end, although device 102a may periodically transmit synchronization packets, such that method 200 in turn repeats periodically.

Although FIG. 2 discloses a particular number of steps to be taken with respect to method 200, method 200 may be executed with greater or fewer steps than those depicted in FIG. 2. In addition, although FIG. 2 discloses a certain order of steps to be taken with respect to method 200, the steps comprising method 200 may be completed in any suitable order.

Method 200 may be implemented using system 100 and/or any other system operable to implement method 200. In certain embodiments, method 200 may be implemented partially or fully in software and/or firmware embodied in computer-readable media.

In some instances, in particular where device 102a does not require data from other devices 102b, 102c, device 102a may increase its transmission of synchronization packets in order to enable PLLs 120 of devices 102b, 102c to lock more quickly. In such instances, a synchronization packet transmitted by device 102a may include only synchronization information and no requests for data embedded within the synchronization packet. Further, in some instances, the timing of the synchronization packet may be offset relative to the timing of the data packets (e.g., the one or more first data packets and the one or more second data packets) transmitted onto shared digital wired communication link 104.

The foregoing discussion contemplates three devices 102 for the purposes of clarity and exposition. However, it is understood that system 100 may include any number of suitable devices 102, wherein the sequencing of transmission of devices 102 may take place in order (e.g., each device 102 transmits after another device 102 has completed transmission) as contemplated herein.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising a plurality of devices coupled to one another via a shared digital wired communication link, the plurality of devices comprising:
   a first device configured to periodically transmit a synchronization packet onto the shared digital wired communication link to synchronize other of the plurality of devices to a reference clock of the first device;
   a second device configured to receive the synchronization packet and transmit one or more first data packets onto the shared digital wired communication link in response to the synchronization packet; and
   a third device configured to receive the synchronization packet and transmit one or more second data packets onto the shared digital wired communication link in response to the synchronization packet and the one or more second data packets;
   wherein:
      each of the plurality of devices other than the first device use timing parameters of the synchronization packet to align its internal clock reference;

at least one device of the plurality of devices comprises a phase-locked loop used to lock its internal clock reference to timing parameters of the synchronization packet; and the first device increases frequency of its transmission of synchronization packets when data is not required from the second device and the third device in order to enable the phase-locked loops to lock more quickly.

2. The system of Claim 1, wherein the third device transmits the one or more second data packets after completion of transmission of the one or more first data packets.

3. The system of claim 1, wherein the synchronization packet comprises information defining an order of transmission of data packets from the plurality of devices in response to the synchronization packet.

4. The system of claim 1, wherein one of the one or more first data packets comprises information identifying a next device of the plurality of devices to transmit data in response to the synchronization packet.

5. The system of claim 1, wherein the synchronization packet comprises information defining data sought from the plurality of devices.

6. The system of claim 1, wherein timing of the synchronization packet is offset relative to the timing of the one or more first data packets and the one or more second data packets.

7. The system of Claim 1, wherein each of the one or more first data packets and the one or more second data packets comprise respective sensor information from a respective analog-to-digital converter.

8. A method of for a system comprising a plurality of devices coupled to one another via a shared digital wired communication link, the method comprising:
  periodically transmitting, by a first device of the plurality of devices, a synchronization packet onto the shared digital wired communication link to synchronize other of the plurality of devices to a reference clock of the first device;
  receiving, by a second device of the plurality of devices, the synchronization packet;
  transmitting, by the second device, one or more first data packets onto the shared digital wired communication link in response to the synchronization packet;
  receiving, by a third device of the plurality of devices, the synchronization packet; and
  transmitting, by the third device, one or more second data packets onto the shared digital wired communication link in response to the synchronization packet and the one or more second data packets;
  each of the plurality of devices other than the first device using timing parameters of the synchronization packet to align its internal clock reference;
  at least one device of the plurality of devices using a phase-locked loop to lock its internal clock reference to timing parameters of the synchronization packet; and
  the first device increasing frequency of its transmission of synchronization packets when data is not required from the second device and the third device in order to enable the phase-locked loops to lock more quickly.

9. The method of claim 8, further comprising the third device transmitting the one or more second data packets after completion of transmission of the one or more first data packets.

10. The method of claim 8, wherein the synchronization packet comprises information defining an order of transmission of data packets from the plurality of devices in response to the synchronization packet.

11. The method of claim 8, wherein one of the one or more first data packets comprises information identifying a next device of the plurality of devices to transmit data in response to the synchronization packet.

12. The method of claim 8, wherein the synchronization packet comprises information defining data sought from the plurality of devices.

13. The method of claim 8, wherein timing of the synchronization packet is offset relative to the timing of the one or more first data packets and the one or more second data packets.

14. The method of claim 8, wherein each of the one or more first data packets and the one or more second data packets comprise respective sensor information from a respective analog-to-digital converter.

* * * * *